(12) United States Patent
Peters

(10) Patent No.: US 7,124,240 B2
(45) Date of Patent: Oct. 17, 2006

(54) METHOD AND CIRCUIT FOR INCREASING THE MEMORY ACCESS SPEED OF AN ENHANCED SYNCHRONOUS SDRAM

(75) Inventor: Michael Peters, Colorado Springs, CO (US)

(73) Assignee: Purple Mountain Server LLC, Los Altos, CA (US)

( * ) Notice: Subject to any disclaimer, the term of this patent is extended or adjusted under 35 U.S.C. 154(b) by 0 days.

(21) Appl. No.: 10/782,386

(22) Filed: Feb. 18, 2004

(65) Prior Publication Data

US 2004/0225852 A1 Nov. 11, 2004

Related U.S. Application Data

(63) Continuation of application No. 09/828,488, filed on Apr. 5, 2001, now abandoned.

(51) Int. Cl.
G06F 12/00 (2006.01)
(52) U.S. Cl. ........................ 711/105; 711/118
(58) Field of Classification Search ............. 711/104, 711/105, 118, 122, 165; 365/189.04, 221, 365/230.03
See application file for complete search history.

(56) References Cited

U.S. PATENT DOCUMENTS

| | | | |
|---|---|---|---|
| 5,025,421 A | 6/1991 | Cho | |
| 5,226,009 A | 7/1993 | Arimoto | |
| 5,301,162 A | 4/1994 | Shimizu | |
| 5,421,000 A | 5/1995 | Fortino et al. | |
| 5,528,552 A | 6/1996 | Kamisaki | |
| 5,680,363 A | 10/1997 | Dosaka et al. | |
| 5,692,148 A * | 11/1997 | Kundu | 711/105 |
| 5,706,244 A | 1/1998 | Shimizu | |
| 5,721,862 A | 2/1998 | Sartore et al. | |
| 5,748,914 A * | 5/1998 | Barth et al. | 710/105 |
| 5,881,009 A | 3/1999 | Tomita | |
| 5,887,272 A | 3/1999 | Sartore et al. | |
| 5,900,011 A | 5/1999 | Saulsbury et al. | |
| 5,950,220 A | 9/1999 | Quach | |
| 6,295,593 B1 | 9/2001 | Hsu et al. | |
| 6,526,471 B1 | 2/2003 | Shimomura et al. | |
| 6,546,453 B1 | 4/2003 | Kessler et al. | |
| 2002/0003741 A1* | 1/2002 | Maesako et al. | 365/230.03 |

OTHER PUBLICATIONS

Dosaka, K. et al.; "A 100-MHz 4-Mb Cache DRAM with Fast Copy-Back Scheme"; *IEEE Journal of Solid-State Circuits*; Nov. 1992.
Enhanced Memory Systems, Inc.; "Preliminary Data Sheet,— 64Mbit—Enhanced SDRAM, 8Mx8, 4Mx16 ESDRAM"; pp. 1-33; 2000 Enhanced Memory Systems, 1850 Ramtron Drive, Colorado Springs, Colorado, (800) 545-DRAM, http://www.edram.com.

* cited by examiner

*Primary Examiner*—Woo H. Choi
(74) *Attorney, Agent, or Firm*—Townsend and Townsend and Crew LLP

(57) ABSTRACT

An SDRAM and method for operating it provide for increased data access speed. The SDRAM includes a central memory region with memory blocks arranged in sets on respective opposite sides. A plurality of primary sense amplifier sets are provided, each set being associated with a respective pair of the memory blocks and located adjacent thereto. A row cache is provided in the central memory region, and row decoders decode a row address in response to a "bank activate" command and move data from a decoded row address into a primary sense amplifier set associated with a memory block containing the decoded row address and into the row cache, prior to application of a "read" command to the SDRAM. Column decoders decode a column address in response to a "read" command and for reading data from the cache in accordance with the decoded column address.

11 Claims, 2 Drawing Sheets

METHOD AND CIRCUIT FOR INCREASING THE MEMORY ACCESS SPEED OF AN ENHANCED SYNCHRONOUS SDRAM

CROSS-REFERENCES TO RELATED APPLICATIONS

The present application is a continuation of U.S. patent application Ser. No. 09/828,488 for: "Method and Circuit for Increasing the Memory Access Speed of an Enhanced Synchronous SDRAM" filed Apr. 5, 2001 now abandoned.

BACKGROUND OF THE INVENTION

1. Field of the Invention

This invention relates to improvements in memory architectures and methods for operating same, and more particularly, to improvements in memory architectures and operations thereof for increasing the speed of data transfers between the memory array and a cache memory associated therewith.

2. Relevant Background

During recent years, the memory industry has begun to investigate and widely use synchronous DRAMs (SDRAMs). SDRAMs have begun to be so commonplace, that often the reference to its synchronous nature is dropped, and they are referred to simply as DRAMs. However, to avoid confusion, synchronous DRAMs will be consistently referred to herein as "SDRAMs".

As SDRAMs have developed, they have been operated at ever increasing clock speeds. The SDRAMS of the second generation were called double data rate (DDR) SDRAMs, and are now often referred to as "DDR-I" SDRAMs. In the second generation of synchronous SDRAMs, clock frequencies of 133 MHz were common. Recently, a third new generation of synchronous SDRAMs are being defined to operate at speeds of two times or greater than DDR-I SDRAMs, and are sometimes referred to as "DDR-II" SDRAMs.

The clock frequencies presently being investigated for DDR-II SDRAMS are on the order of about 200–400 MHz. Although the clock frequencies of the SDRAMs have been increasing, the actual signal delays as the signals propagate through the memory circuitry have not been concomitantly decreased. Thus, one might expect that an increased clock speed applied to an SDRAM might increase the data rate available from the SDRAM, or, alternatively, reduce the access time to the data in the SDRAM. However, the memory elements themselves in the SDRAMs are generally substantially the same, and, therefore, require the same amount of access time, regardless of the clock speed. Thus, an increased clock speed generally only enables the data to be accessed in about the same time frame as devices with lower clock speeds. As a result, devices that operate at higher clock speeds merely require a larger number of clock cycles to access the data in the same time frame.

To address the goal in the design of memory devices of achieving increased access speeds, it has been proposed to include cache memory elements in the device into which the contents of the SDRAM array may be temporarily stored prior to being delivered to the output of the memory. As used herein, the term "cache" or "cache memory" is used to refer to a data latch, register, memory, or other suitable circuit that can temporarily hold or store data read from a memory array prior to being delivered to the output of the memory. Among other things, the cache memory serves to reduce the overhead associated with the SDRAM array by allowing data access to occur while the precharge and next activation of the array is underway. This effectively speeds up the overall data rate by eliminating otherwise dead periods.

Thus, when an element from the memory array is read, it is detected by a sense amplifier that is associated with the memory cell being read, then subsequently delivered from the sense amplifier to the cache memory element that is at least temporarily associated therewith. One example of a memory array having a cache memory is shown in copending patent application Ser. No. 09/689,219, filed Oct. 11, 2000, said application being assigned to the assignee hereof, and incorporated herein by reference.

Today, in memory architectures, in general, and SDRAM architectures, in particular, one physical circuit layout that has been suggested includes sets of sense amplifiers alternating with memory array blocks serviced by the sense amplifiers. See, for example, U.S. Pat. No. 5,887,272, which is assigned to the assignee hereof, and which is incorporated herein by reference. The sense amplifiers are arranged in stripes between adjacent SDRAM array blocks. Each sense amplifier stripe may be connected to selectively service the SDRAM cells on both sides of the stripe. Thus, the sense amplifiers in a particular sense amplifier stripe may be selectively connected to selected memory cells on either the memory array located on left of the stripe, or to selected memory cells located on the right of the stripe.

Additionally, memory arrays are becoming increasingly dense. For example, SDRAM designers are under constant tension to design SDRAM circuits more densely, but at the same time, to include larger amounts of functionality in the circuit. One of the techniques that integrated circuit manufacturers have used to address these problems is to place greater and greater emphasis on multi-layered structures. For example, above the active regions of the device, one or more layers of interconnecting metal or other conducting material, such as polysilicon, or the like, may be used. However, as the number of the layers increases, the planarity of the surface on which subsequent layers are formed becomes increasingly uneven. As a result, the overlying or subsequently formed structures have a tendency to be susceptible to discontinuities, due to step-like structures that form at the surface. As a result, the pitch of the interconnect structures generally cannot be designed at too low a level. (The pitch of an interconnect is regarded as the distance between an interconnect structure and its closest neighbor, plus the dimension of the interconnect itself.)

One SDRAM example is class of SDRAM devices, called the "Enhanced SDRAM", or "ESDRAM", which has been recently introduced by Enhanced Memory Systems, Inc. of Colorado Springs, Colo. An example is the SM2603 and SM2604 Enhanced SDRAM (ESDRAM) devices, which are a 64 Mbit JEDEC superset standard SDRAM. While pin, function, and timing are compatible with standard SDRAMs, they have a speed and architecture that optimizes system price/performance in high performance main memory, video graphics, and embedded systems.

This 64 Mbit ESDRAM is a high-speed SDRAM configured as four banks of SDRAM with an SRAM row cache per bank and a synchronous interface. All inputs are registered and all outputs are driven on rising clock edges. Within each bank, the devices are organized as 4096 rows of 4096 bits each. Within each row, the 8M×8 device has 512 column address locations and the 4M×16 device has 256 column locations. Read and write accesses are accomplished by opening a row and selecting a column address location for the transaction. A "bank activate" (BA) command instructs the device to open a row in one of the four banks, though all four banks may be active simultaneously. A subsequent "read" or "write" command instructs the device to read data from or write data to a specified column address location.

On a random read access, an SDRAM bank is activated and data is latched into the sense amplifiers. The sense amplifiers now hold a row of data and the row is considered open. A "read" command now causes the entire row to latch into the SRAM row cache, and the data at a specified column address location is driven out. Since the row data is latched into the SRAM row cache, the SDRAM sense amplifiers are decoupled from the data. Therefore, the SDRAM precharge time can be hidden behind a burst read from the row cache. This minimizes subsequent page miss latency. Since both precharge and row address strobe (RAS) to column address strobe (CAS) delays are hidden, the device supports an industry leading CAS latency of one at clock frequencies up to 83 MHz, and CAS latency of two up to 166 MHz. At 166 MHz, all but one cycle of the next random access to any location in the same bank can be hidden. This SDRAM dramatically increases sustained bandwidth by up to two times over standard SDRAM. For interleaved burst read accesses, the entire precharge time is hidden and output data can be driven without any wait states.

Nevertheless, it may be possible to increase still further the data access time of the device.

SUMMARY OF THE INVENTION

In light of the above, therefore, it is an object of the invention to provide an improved SDRAM integrated circuit device.

It is another object of the invention to provide a SDRAM array in which a row, or other portion, of the SDRAM can be read and transferred to a cache memory upon receipt of a "bank activate" command to increase the access time of the device.

These and other objects, features and advantages of the invention will be apparent to those skilled in the art from the following detailed description of the invention, when read in conjunction with the accompanying drawings and appended claims.

According to a broad aspect of the invention, a method is presented for reading data from a synchronous memory of the type having data cells arranged in rows and columns and having a row cache. The method includes receiving an initial command and row address data for reading contents of a row of the memory selected by the row address data in response thereto. The contents of the row selected by the row address data are moved into the row cache, without an intervening command, such as a "read" command. After the contents of the row have been moved into the row cache, a "read" command and column address data are received. In response to the "read" command, data is read from the row cache at a column address specified by the column address data for output by the memory.

According to another broad aspect of the invention, a synchronous memory is presented. The synchronous memory includes a row cache and means for receiving an initial command substantially concurrently with row address data and activating for reading a row of the memory selected by the row address data in response thereto. Means for moving the contents of the row of the memory selected by the row address into the row cache are provided, and means for receiving a "read" command substantially concurrently with column address data after the contents of the row has been moved into the row cache are also provided. Means for reading data from the row cache at a column address specified by the column address data in response to the "read" command are provided as well as means for moving the data read from the row cache to an output of the memory after a predetermined number of clock cycles thereafter.

According to yet another broad aspect of the invention, an SDRAM adapted to receive "bank activate" and "read" commands is provided. The SDRAM includes a central memory region and a plurality of memory blocks arranged in first and second sets on respective opposite sides of the central memory region. A plurality of primary sense amplifier sets are provided, each set associated with a respective pair of the memory blocks and located adjacent thereto. A row cache is provided in the central memory region, and row decoders decode a row address in response to a "bank activate" command and move data from a decoded row address into a primary sense amplifier set associated with a memory block containing the decoded row address and into the row cache, prior to application of a "read" command to the SDRAM. Column decoders decode a column address in response to a "read" command and for reading data from the row cache in accordance with the decoded column address.

BRIEF DESCRIPTION OF THE DRAWINGS

The invention is illustrated in the accompanying drawings, in which.

In the various figures of the drawing, like reference numerals are used to denote like or similar parts.

DETAILED DESCRIPTION OF THE PREFERRED EMBODIMENTS

As mentioned above, although the clock frequencies of synchronous SDRAMs (SDRAMs) have been increasing, the actual signal delays as the signals propagate through the memory circuitry have not been concomitantly decreased. Typically, the outputs of an SDRAM are driven on the rising edge of the clock. Generally, four memory banks are organized, as desired, for instance, in four blocks, each containing 4,096 rows of 4,096 bits in a 64 Mbit device, or in some other convenient arrangement to form a memory device of other size. The blocks of a 64 Mbit device may be arranged, for example, as an 8M×8 or 4M×16 SDRAM. For instance, in an 8M×8 device, 512 column address locations may be provided, and in a 4M×16 device, 256 column locations may be provided.

Typically, read accesses are accomplished by opening a row and subsequently selecting a column address location for the transaction. A "bank activate" command instructs the device to open a row in one of the four banks. A subsequent "read" command instructs the device to read data from a specified column address location.

Thus, in typical operation of a prior art device, when a row of data is desired to be accessed, a row selection is made, for example, concurrently with the "bank activate" command. The data at the selected row is transferred to primary sense amplifiers that are closely located to the block in which the selected row is contained. Then, when a subsequent "read" command is issued, column address data is applied to the SDRAM, and is propagated to the remotely located primary sense amplifiers. The data at the selected column address is then transferred back to secondary sense amplifiers in a central block of the device.

These transfers of selected row and column data all of the way out to the remote primary sense amplifier locations and the subsequent propagation of the data back from the primary sense amplifiers to the central secondary sense amplifiers or latches adds unnecessary time to the access time of the device. These propagation delays can be significant in terms of the recent speed demands that are placed on the SDRAMs. However, utilizing the cache memory embodiments described below and in said copending patent application Ser. No.09/689,219, some of these delays can be significantly reduced.

Figure 1:
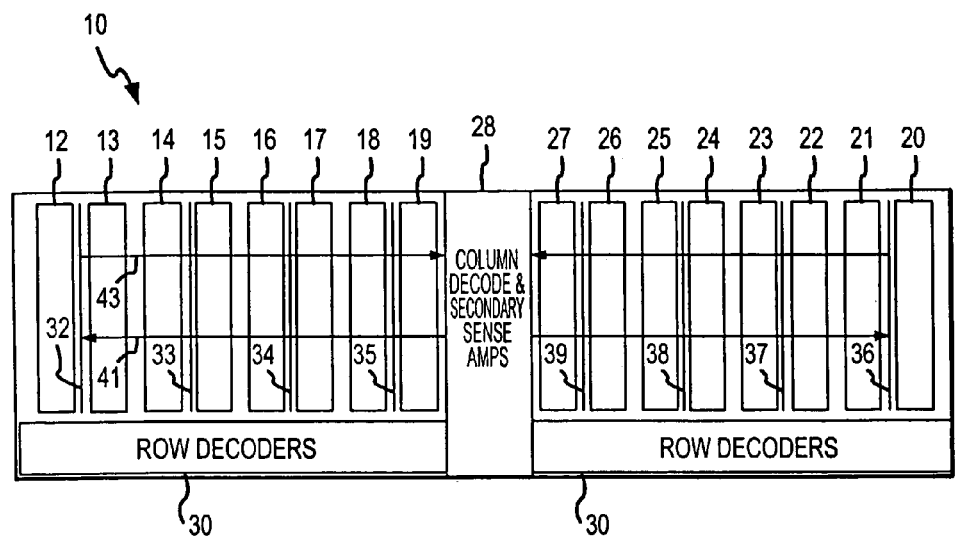
FIG. 1 is a diagram showing a physical SDRAM layout illustrating the relationship between the various SDRAM arrays, the sense amplifier stripes, and interconnecting buses, and illustrating the data movement patterns therein, in accordance with the prior art.

One prior art DDR-II SDRAM memory arrangement 10 that has been proposed is illustrated in the diagram of FIG. 1 to which reference is now made. The diagram of FIG. 1 shows a block diagram of a DDR-II SDRAM and the signal flow paths of interest therein. The SDRAM architecture 10 includes a plurality of memory blocks 12–27 arranged on either side of a central block 28 that contains central column decoders and secondary sense amplifiers. Beneath each of the sections of memory blocks 12–27 are respective row decoders 30. The memory blocks 12–27 are arranged in respective sections on each side of the central block 28, and a plurality of such memory arrangements may be included in a single device.

Typically, primary row sense amplifiers (not shown) are located in spaces 32–39 between respective pairs of the memory blocks 12–27, so that they may be shared in operation. For example, a set of primary row sense amplifiers may be located in the space 32 between memory blocks 12 and 13, another in the space 33 between memory blocks 14 and 15, and so on.

The primary row sense amplifiers between the memory blocks 12 and 13 at the furthest distance from the block 28 represents the worst case column decode delay, since the column identification data must travel the furthest to reach the primary sense amplifiers at this location. However, delays are also inherent with respect to the primary sense amplifiers at the other locations as well.

Thus, in operation, first when a "bank activate" signal is applied to the device, row address data is applied substantially concomitantly, or in association therewith. The row address is transmitted to the desired row location, and the data contained at the selected row is moved from the memory block in which it is contained to the primary row sense amplifiers associated therewith. For example, if the row selected is contained in block 12 or 13, the data in the selected row is transferred to the primary sense amplifiers in space 32 adjacent to and associated therewith.

Subsequently, when a "read" command is applied to the device 10, substantially concomitantly or in association with column address, the column address is transmitted to the location of the primary sense amplifiers that contain data at the previously selected row address, for example along path 41. The data at the column address in the selected row is then returned along bus path 43 to the secondary sense amplifiers within the central block 28 for subsequent transfer to the I/O pins of the device. If desired, a burst length, for example, of four or more words, may be driven back across the array to the secondary sense amplifiers, prefetched into a buffer, and pipelined to the output pins.

It can be seen that this results in a signal propagation delay, at worst, of two times one-half of the memory distance of the memory banks of the array if the sense amplifiers of the selected row are located between the outermost memory blocks. Memory requests in most computer systems occur in multiple in-page (within same row) read requests. A standard DDR-II device must keep the row active in order to service more than one "read" command. Therefore, the device must incur the path delays of lines 41 and 43 for every in-page read cycle.

In contrast, according to a preferred embodiment of the invention, the propagation delay of an SDRAM is significantly reduced by taking advantage of the existence of an on-board or on-chip cache to receive the entire selected row of data immediately upon the receipt of the "bank activate" signal. According to the invention, the data contained in the selected row is entirely and immediately moved to the cache. Thus, upon the subsequent receipt of the "read" command, only the column data needs to be decoded. This can be done locally in the cache, without requiring the column addresses to be propagated out into the memory array to retrieve the data thereat. This reduces the signal propagation delay by one-half of the memory distance to the selected memory banks of the array. This results in increasing the read and write operating speed of the device, and reducing the read latency to subsequent column address locations.

Figure 2:
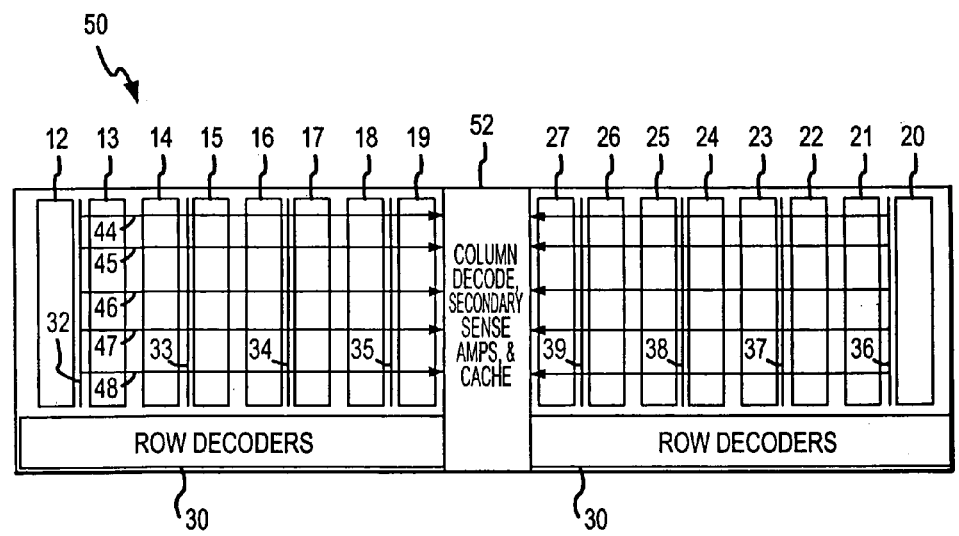
FIG. 2 is a diagram showing a physical SDRAM layout illustrating the relationship between the various SDRAM arrays, the sense amplifier stripes, the cache memory stripes, and the interconnecting buses, and illustrating the data movement patterns therein, in accordance with a preferred embodiment of the invention.

A diagram of an SDRAM architecture 50, according to a preferred embodiment of the invention, is shown in FIG. 2, to which reference is now additionally made. The SDRAM architecture 50 includes a plurality of memory blocks 12–27 arranged on either side of a block 52 that contains row decode, secondary sense amplifiers, and a data cache. Beneath each of the sections of memory blocks 12–27 are respective row decoders 30. The memory blocks 12–27 are arranged in respective sections on each side of the decoder, sense amplifier, and cache block 52.

In contrast to the prior art device of FIG. 1, the enhanced architecture includes a data cache in the central circuit block 52. The cache is used to latch the entire selected row data, and allows the SDRAM array to be precharged or refreshed while concurrently enabling access to the selected data.

In operation, upon receipt of the "bank activate" command, the device 50 decodes a row of data within a specified bank. The data contained in the decoded memory elements in a respective one of the memory blocks 12–27 are sensed in the respective primary sense amplifiers in the interspaces 32–39 between the blocks 12–27, and immediately conducted on buses 44–48 to the cache in the block 52.

Thereafter, when the "read" command and column address is received, the data contained in the cache in block 40 is decoded to select data cells at the selected column within the cache for output from the device. Since the data selected by the row address is entirely contained in the cache, the device can be operated in burst or page mode, with the particularly selected data being immediately ready for pipelined output from the cache. Thus, the secondary sense amps are utilized only during the initial bank activation (row decoding and cache loading) time. Multiple in-page (within same row) read requests may then be serviced out of the row registers.

Figure 3:
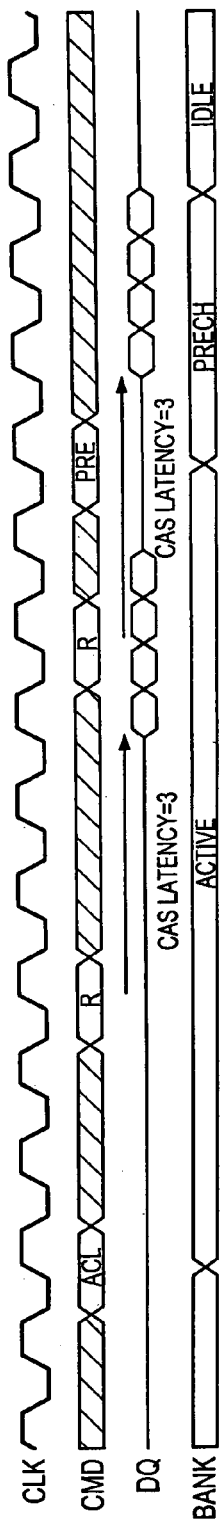
FIG. 3 shows timing diagrams and event occurrence timings in the operation of the memory of FIG. 1, without a row data cache in accordance with the prior art.
Figure 4:
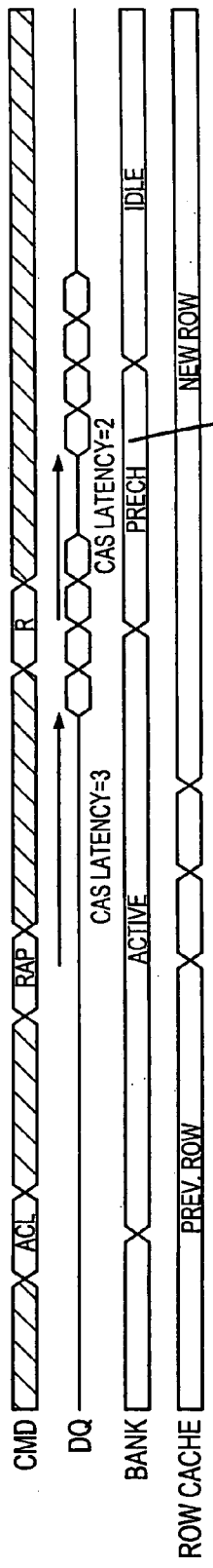
FIG. 4 shows timing diagrams and event occurrence timings in the operation of the memory of FIG. 1, with a row data cache in accordance with the prior art.

The performance improvement of the method and architecture of the invention can be appreciated from a comparison of the timing waveforms illustrating the respective operations of the prior art memory of FIG. 1 without a row data cache, in FIG. 3, with a row data cache, in FIG. 4, with the data transfer timing in the operation of the memory of FIG. 2, in accordance with a preferred embodiment of the invention.

As can be seen from the timing diagrams of FIG. 3, a CAS latency of 3 occurs due to the data transfer delays described above with respect to the operation of the memory architecture of FIG. 1. If a data cache is added, as shown in FIG. 4, the first data access still has a CAS latency of 3, with subsequent accesses having a CAS latency of 2.

Figure 5:
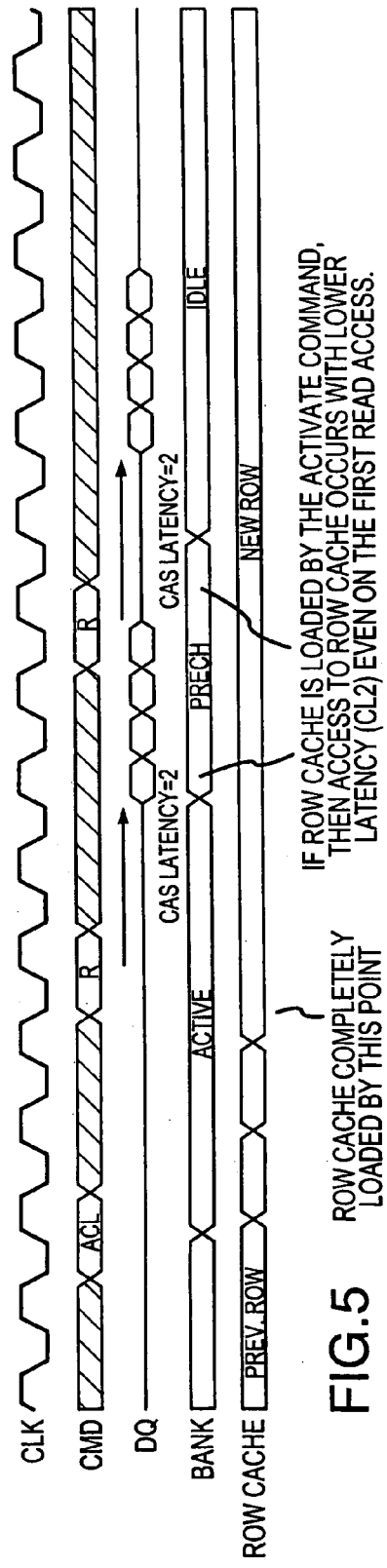
FIG. 5 shows timing diagrams and event occurrence timings in the operation of the memory of FIG. 2, in accordance with a preferred embodiment of the invention.

In comparison, with reference to FIG. 5, a CAS latency of 2 is produced using the memory architecture of FIG. 2, regardless of whether the access is the first or a subsequent access. Currently, DDR-II SDRAMs start at a 256 Mbit density and a data rate of 400 Mbps at a 200 MHz clock frequency. Clock rates are expected to increase to 400 MHz and beyond, which will likely increase the latencies in clock cycles to 4 or more. One clock cycle at 500 MHz is only 2 ns. By caching the entire row and avoiding the column decode/data transfer times across the array, the CAS latency of the device is reduced by a clock cycle. Today's system benchmarks clearly demonstrate that reducing the data read latency yields up to 10% higher system performance.

Although the invention has been described and illustrated with a certain degree of particularity, it is understood that the present disclosure has been made only by way of example, and that numerous changes in the combination and arrangement of parts can be resorted to by those skilled in the art without departing from the spirit and scope of the invention, as hereinafter claimed.

The invention claimed is:

1. A method for reading data from a synchronous memory of the type having data cells arranged in rows and columns, comprising:

arranging said synchronous memory in a symmetrical layout along a horizontal direction to include:
a left plurality of N memory portions including a left memory block, a central sense amplifier block, and a right memory block arranged along said horizontal direction;
one centrally located single row cache;
a secondary sense amplifier block co-located with said centrally located single row cache; and
a right plurality of N memory portions including a left memory block, a central sense amplifier block, and a right memory block arranged along said horizontal direction, said single row cache disposed between said left plurality of memory portions and said right plurality of memory portions,
wherein N is at least equal to two;
receiving an initial command that is not a "read" command and receiving row address data for reading contents of a row of said synchronous memory selected by said row address data, said initial command exclusive of column address data;
moving said contents of said row into said single row cache;
after said contents of said row have been moved into said single row cache, receiving a "read" command and column address data; and
in response to said "read" command, reading data from said single row cache at a column address specified by said column address data for output by said synchronous memory.

2. The method of claim 1 wherein said initial command is received substantially concurrently with said row address data.

3. The method of claim 1 wherein said "read" command and said column address data are received substantially concurrently.

4. The method of claim 1 further comprising moving data read from said single row cache to an output of said synchronous memory after a predetermined number of clock cycles after said "read" command.

5. The method of claim 4 wherein moving said data read from said row cache to an output of said synchronous memory after a predetermined number of clock cycles comprises moving said data read from said single row cache to an output of said memory after two clock cycles.

6. The method of claim 4 wherein said predetermined number of clock cycles is two.

7. The method of claim 1 wherein said receiving an initial command comprises receiving a "bank activate" command.

8. The method of claim 1 further comprising performing a first precharging operation prior to receiving said initial command.

9. The method of claim 4 further comprising initiating a memory operation after said contents of said row have been moved into said single row cache and before said data read from said single row cache has been moved to said output of said synchronous memory.

10. The method of claim 9 wherein said memory operation comprises a precharging operation.

11. The method of claim 9 wherein said synchronous memory comprises a SDRAM array.

* * * * *